US010467354B2

(12) United States Patent
Beiner

(10) Patent No.: US 10,467,354 B2
(45) Date of Patent: Nov. 5, 2019

(54) VISUALIZATION OF ELECTRICAL LOADS

(71) Applicant: Energybox Ltd., Wanchai (HK)

(72) Inventor: Dirk Beiner, Paderborn (DE)

(73) Assignee: ENERGYBOX LTD., Wanchai (HK)

( * ) Notice: Subject to any disclaimer, the term of this patent is extended or adjusted under 35 U.S.C. 154(b) by 667 days.

(21) Appl. No.: 14/586,696

(22) Filed: Dec. 30, 2014

(65) Prior Publication Data

US 2016/0188763 A1  Jun. 30, 2016

(51) Int. Cl.
G06F 17/50 (2006.01)
G01D 4/00 (2006.01)
H01H 9/16 (2006.01)

(52) U.S. Cl.
CPC ........... *G06F 17/5009* (2013.01); *G01D 4/00* (2013.01); *H01H 9/167* (2013.01); *Y04S 20/38* (2013.01)

(58) Field of Classification Search
None
See application file for complete search history.

(56) References Cited

U.S. PATENT DOCUMENTS

| | | |
|---|---|---|
| 4,518,957 A | 5/1985 | Wheeler |
| 4,611,201 A | 9/1986 | Guim et al. |
| 4,706,073 A | 11/1987 | Vila Masot |
| 5,699,276 A | 12/1997 | Roos |
| 5,877,691 A | 3/1999 | Suptitz et al. |
| 6,330,516 B1 | 12/2001 | Kammeter |
| 8,344,724 B2 | 1/2013 | Leeb et al. |
| 8,350,417 B1 | 1/2013 | Dooley et al. |
| 8,805,628 B2 | 8/2014 | Patel et al. |
| 8,930,152 B2 | 1/2015 | Patel et al. |

(Continued)

FOREIGN PATENT DOCUMENTS

| | | |
|---|---|---|
| CN | 101393824 A | 3/2009 |
| CN | 202616875 U | 12/2012 |

(Continued)

OTHER PUBLICATIONS

Instruction Leaflet IB2C12063H03, Instructions for Installation, Operation and Maintenance of Magnum SB Insulated Case Low Voltage Power Circuit Breakers, Eaton, Mar. 2012.*

(Continued)

*Primary Examiner* — Bijan Mapar
(74) *Attorney, Agent, or Firm* — Slater Matsil, LLP

(57) ABSTRACT

A visualization system for visualizing electrical loads of an electrical distribution panel is disclosed in one embodiment. The system includes a sensor arrangement for sensing an electrical load of a plurality of electrical circuits protected by corresponding circuit breakers of the distribution panel and for providing corresponding sensor data, a data processing system for aggregating and storing the sensor data of the sensor arrangement, and a portable device. The portable device includes an image capturing unit and a display screen. It is configured to obtain a live image of at least a part of the electrical distribution panel from the image capturing unit, to identify individual circuit breakers within the live image, to obtain load information at least for the identified circuit breakers from the data processing system and to display the obtained load information in a structured way on the display screen of the portable device.

24 Claims, 3 Drawing Sheets

(56) References Cited

U.S. PATENT DOCUMENTS

| | | |
|---|---|---|
| 9,054,516 B2 | 6/2015 | Watford |
| 2003/0050737 A1 | 3/2003 | Osann, Jr. |
| 2003/0216877 A1 | 11/2003 | Culler et al. |
| 2003/0225482 A1 | 12/2003 | Topka et al. |
| 2005/0097373 A1 | 5/2005 | Stoupis et al. |
| 2006/0082468 A1 | 4/2006 | Wang et al. |
| 2008/0255782 A1 | 10/2008 | Bilac et al. |
| 2009/0072022 A1 | 3/2009 | Tripathi |
| 2009/0115426 A1 | 5/2009 | Muench, Jr. et al. |
| 2009/0271725 A1* | 10/2009 | Dirla .................... H04L 41/12 715/771 |
| 2010/0020724 A1 | 1/2010 | Wimmer et al. |
| 2010/0076615 A1 | 3/2010 | Daniel et al. |
| 2010/0094475 A1 | 4/2010 | Masters et al. |
| 2010/0256934 A1 | 10/2010 | Rohrbaugh |
| 2010/0264906 A1 | 10/2010 | Shamir et al. |
| 2011/0029149 A1 | 2/2011 | Wimmer |
| 2011/0074382 A1 | 3/2011 | Patel |
| 2011/0208450 A1 | 8/2011 | Salka et al. |
| 2011/0251807 A1 | 10/2011 | Rada et al. |
| 2012/0054125 A1 | 3/2012 | Clifton et al. |
| 2012/0062249 A1 | 3/2012 | Shamir |
| 2012/0068692 A1 | 3/2012 | Patel et al. |
| 2012/0271576 A1 | 10/2012 | Kamel et al. |
| 2013/0039034 A1 | 2/2013 | Baer et al. |
| 2013/0119972 A1 | 5/2013 | Maguire et al. |
| 2013/0187636 A1 | 7/2013 | Kast et al. |
| 2013/0229173 A1 | 9/2013 | Bertrand |
| 2013/0254896 A1 | 9/2013 | Helmschmidt et al. |
| 2013/0271111 A1 | 10/2013 | Makanawala |
| 2013/0271895 A1 | 10/2013 | Kuhns |
| 2013/0320776 A1 | 12/2013 | Cook |
| 2014/0055886 A1 | 2/2014 | Spangenberg et al. |
| 2014/0170971 A1* | 6/2014 | Walsh ................. H04B 5/0031 455/41.1 |
| 2014/0210453 A1 | 7/2014 | El-Essawy et al. |
| 2015/0193982 A1* | 7/2015 | Mihelich ............... H04W 4/026 345/633 |

FOREIGN PATENT DOCUMENTS

| | | |
|---|---|---|
| DE | 102007047920 A1 | 12/2008 |
| EP | 0782002 A1 | 7/1997 |
| EP | 1107274 A1 | 6/2001 |
| EP | 2040280 A2 | 3/2009 |
| EP | 2648313 A2 | 10/2013 |
| JP | 2013531247 A | 8/2013 |
| JP | 2014231994 A | 12/2014 |
| KR | 20120058953 A | 6/2012 |
| KR | 20140035717 A | 3/2014 |
| WO | 03073176 A1 | 9/2003 |
| WO | 2009052121 A2 | 4/2009 |
| WO | 2010119332 A1 | 10/2010 |
| WO | 2011103593 A1 | 8/2011 |
| WO | 2012003492 A2 | 1/2012 |
| WO | 2012007831 A2 | 1/2012 |
| WO | 2012099588 A1 | 7/2012 |
| WO | 2012103138 A1 | 8/2012 |

OTHER PUBLICATIONS

Instructional Leaflet IL2C13762H01, Breaker current sensor and rating plug replacement kit, Eaton, Jan. 2011. (Year: 2011).*

Document No. 0600BR1101, "PowerPact™ with Micrologic™ molded case circuit breakers", Schneider Electric, Jun. 2012. (Year: 2012).*

* cited by examiner

VISUALIZATION OF ELECTRICAL LOADS

CROSS REFERENCE TO RELATED APPLICATIONS

The present application relates to the following co-pending applications. Co-pending U.S. application Ser. No. 14/586,710, filed Dec. 30, 2014, titled "Energy metering system with self-powered sensors" and co-pending U.S. application Ser. No. 14/586,740, filed Dec. 30, 2014, titled "Energy metering system and method for its calibration" disclose other aspects of the inventive energy metering system disclosed herein. In particular, application Ser. No. 14/586,740 provides details regarding the powering of the sensors of the sensor system. Application Ser. No. 14/586,740 provides further details regarding the calibration and operation of the energy metering system. The above co-pending applications are incorporated herein by reference.

TECHNICAL FIELD

The present invention relates to energy metering systems for visualizing electrical loads of a distribution panel. In particular, the present invention relates to a visualization system for visualizing electrical loads of an electrical distribution panel on a per circuit basis using a portable device. The invention further relates to methods, devices and smartphone apps for visualization electrical loads, and in particular to a method and smartphone app for visualization of electrical loads of a circuit panel on a per circuit basis using a portable device and a sensor device to be arranged on a surface of a housing of at least one circuit breaker.

BACKGROUND

In conventional energy distribution networks, the energy consumption of a site is typically measured at a central supply point, e.g. between a supply line of the energy supplier and the first distribution panel of a given site, for example a single building or a distinct part of a building such as an apartment or the like. In this way, all electrical energy consumed at that particular site can be measured, irrespective of the electrical distribution system of the given site.

Conventional energy metering devices locally record the total use of electrical energy. Such energy metering systems need to be read at regular intervals by the energy consumer, the energy provider or a service company. More recently, so-called smart metering devices have been introduced in several countries. In a smart metering system, a smart metering device communicates the amount of energy consumed at a particular site back to a utility provider, e.g. the energy provider or a service company. In some instances, the amount of energy consumed is reported on request only, e.g. for preparation of a utility bill. Other smart energy metering systems allow a more regular feedback of energy consumption data, for example every day or every hour.

Reporting an energy consumption back to the utility provider at regular intervals allows the implementation of new charging policies. For example, energy consumers may be rewarded with lower prices by an energy provider if they avoid excessive energy consumption in times of high demand, and instead shift their energy consumption to periods of low demand, such as the night.

While such systems are useful on a macroscopic level, in many cases, energy metering systems measuring the energy consumption of a relatively large site at a single point are insufficient in order to analyze the energy consumption at that site in detail. For example, a user may detect that he or she uses an above-average amount of energy at a particular time of the day but may be unable to detect where in the house or apartment this energy is consumed.

To overcome this problem, devices have been developed that allow the measurement of the electrical load of a particular device. Such devices can either be installed fixedly at relevant points of an energy distribution network or may be provided as an intermediate device, plugged in between a wall outlet and a device under scrutiny. While these devices are useful in identifying electrical devices causing a particularly high electrical load, their installation and use is relatively complex, leading to either high installation cost or limited use. Moreover, they do not allow to obtain an overview over an entire electrical installation of a site.

In this context, it is a challenge of the present invention to describe energy metering systems and associated methods for their operation that allow an energy consumer or an electrician to obtain a more detailed assessment of the electric energy consumption at a particular site. Preferably, the energy metering system should be easy to deploy and operate and provide an intuitive overview of the electrical loads at a site.

SUMMARY

According to a first aspect of the present invention, a visualization system for visualizing electrical loads of an electrical distribution panel is disclosed. The visualization system comprises a sensor arrangement for sensing an electrical load of a plurality of electrical circuits protected by corresponding circuit breakers of the distribution panel and for providing corresponding sensor data. The visualization system further comprises a data processing system for aggregating and storing the sensor data of the sensor arrangement and a portable device. The portable device comprises an image capturing unit and a display screen, and is configured to obtain a live image of at least a part of the electrical distribution panel from the image capturing unit, to identify individual circuit breakers within the live image, to obtain load information at least for the identified circuit breakers from the data processing system and to display the obtained load information in a structured way on the display screen of the portable device.

According to another aspect of the present invention, a sensor device to be arranged on a surface of a housing of at least one circuit breaker is disclosed. The sensor device comprises at least one sensor circuit for sensing an electrical load of at least one electrical circuit protected by the at least one circuit breaker and a light-emitting device configured to transmit at least one illumination sequence comprising encoded information.

According to a third aspect of the present invention, a method for visualization of electrical loads of an electrical installation using a portable device is disclosed. The method comprises capturing, by the portable device, a live image of at least a part of an electrical installation, and identifying, by the portable device, at least one sensor device within the captured live image. The method further includes sensing, by the at least one sensor device, an electrical load of at least one electrical circuit associated with the at least one sensor device and obtaining, by the portable device, load information corresponding to the sensed electrical load of the at least one electrical circuit. The obtained load information is displayed by the portable device in a structured way on a display screen of the portable device.

According to a fourth aspect of the present invention, a smartphone app, stored in a non-volatile memory device, for visualization of electrical loads of an electrical installation is disclosed. The smartphone app performs the following steps when executed on at least one processor of a smartphone. The app upon execution captures a live image of at least a part of an electrical installation and identifies at least one sensor device within the captured live image. Load information corresponding to an electrical load of at least one electrical circuit associated with the at least one identified sensor device is obtained. A structured view comprising the obtained load information for display is generated on a display screen of the smartphone.

The described system, method and smartphone app enable a more in-depth analysis of electrical loads at a particular site. In particular, by obtaining load data on a per circuit basis and overlaying a live image of a distribution panel with the obtained load data, a graphical representation of the electrical loads connected to the distribution panel can be generated, which is easy to comprehend for a user. Moreover, the described sensor device enables a direct communication between the sensor system and the portable device, thus allowing an easy identification of individual sensors as well as a communication of load data from the sensor device to the portable device. The described system is particularly easy to set up and operate, even by a consumer.

BRIEF DESCRIPTION OF THE DRAWINGS

Various embodiments of the present invention will be described with reference to the attached drawings. In the drawings, like reference symbols are used for like elements of different embodiments. The attached drawings include.

DETAILED DESCRIPTION OF ILLUSTRATIVE EMBODIMENTS

Figure 1:
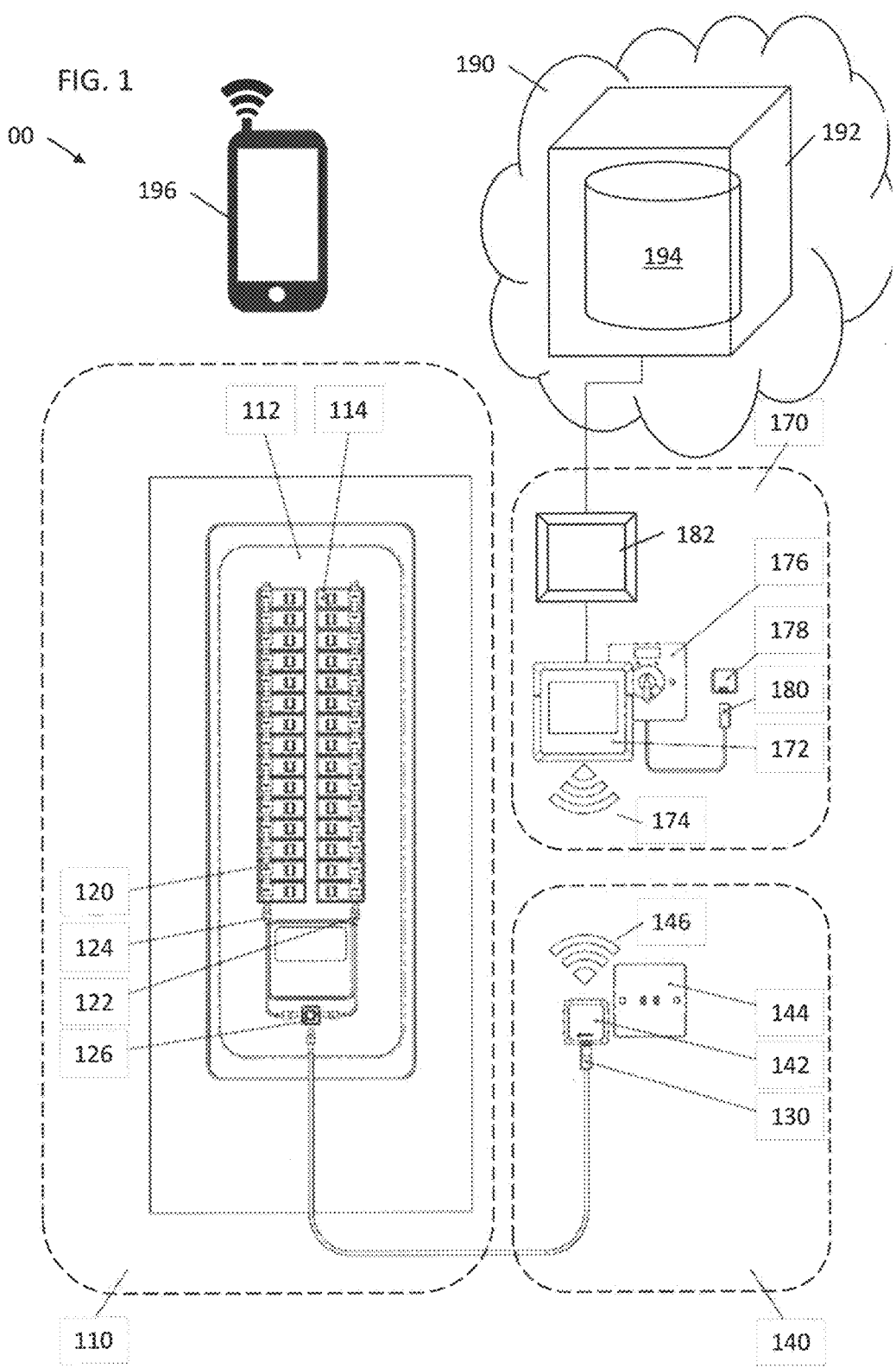
FIG. 1 shows a schematic diagram of an energy metering system in accordance with an embodiment of the invention.

FIG. 1 shows a schematic diagram of an energy metering system 100 in accordance with an embodiment of the present invention. The energy metering system 100 comprises three fixedly installed sub-systems, a sensor sub-system 110, a data collection sub-system 140 and a data analysis sub-system 170. In other embodiments, several of these sub-systems may be omitted, combined or separated into further sub-systems. In addition, the energy metering system 100 comprises a cloud service 192 and a portable device 196.

In accordance with the described embodiment, the sensor sub-system 110 is fitted directly onto a conventional electrical distribution panel 112 or into an enclosing fuse box. In the embodiment shown in FIG. 1, the distribution panel 112 comprises two rows of vertically arranged circuit breakers 114. Of course, in other embodiment, the circuit breakers 114 may be arranged horizontally or in a different number of rows and columns. Each circuit breaker 114 is connected inside the distribution panel 112 to a supply line and connected with one of several circuits of a particular site, such as an apartment or a house. For example, a first circuit breaker 114 may be connected to a first circuit supplying the wall sockets of a bedroom with electrical energy. A second circuit breaker 114 may be connected with a second circuit for supplying the wall sockets of a kitchen with electrical energy. A third circuit breaker 114 may be connected directly to a particular powerful electrical appliance, such as an oven, a heater or an air conditioning system.

In order to obtain load information for each individual circuit, in the described embodiment, a sensor 120 is fitted to each one of the circuit breakers 114. Each sensor 120 is configured for sensing the strength of a magnetic field in the area of the respective circuit breaker 114, such as the magnetic field emitted by a protection coil or other internal component of the circuit breaker 114. In particular, a single-chip synchronous three-axis digital magnetometer configured for determining components of a magnetic field or flux in three different spatial directions may be employed. Such sensors are known, for example, from application US 2013/0229173 A1 of Paul Bertrand, the content of which is incorporated herein by reference, and are therefore not described in detail here.

Figure 2:
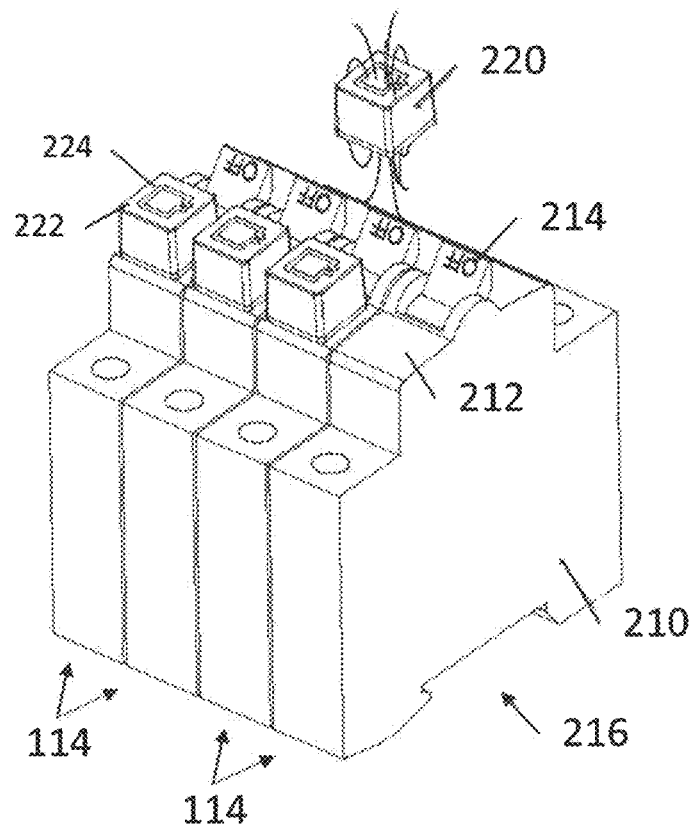
FIG. 2 shows a group of circuit breakers with corresponding sensor devices in accordance with an embodiment of the present invention.

For ease of installation, several of the sensors 120 may be combined to form a sensor device in the form of a sensor strip as detailed below with respect to FIG. 3. Preferably, the individual sensors 120 of a sensor strip may be spaced in accordance with a standardized spacing of circuit breakers 114. In order to accommodate variations in the spacing of the circuit breakers 114, a flexible strip may be used to connect the individual sensors 120. Alternatively, individual sensor devices may be used as shown in FIG. 2. The row of sensors 120 may also comprise dummy sensors, i.e. devices having compatible electrical connections and physical dimensions as the sensors 120 described above. Such dummy sensors may be placed between sensors 120 in places where no circuit breaker 114 is present. Moreover, a single housing of a sensor device may comprise two or more sensors 120, in case double or tandem circuit breakers are installed at the distribution panel 112.

In the described embodiment, each sensor device has an associated microcontroller and/or other circuitry for operating the sensor 120. This may include enforcing an appropriate timing of each measurement with respect to an external clock signal as well as controlling a light emitting element serving as a status display as detailed below in more detail. The microcontroller may also perform data pre-processing, such as digitizing analog measurement results and rejecting obviously incorrect measurements. In case sensor strips or sensor casings with more than one sensor 120 are employed, a single microcontroller may be shared by multiple sensors 120.

In the described embodiment, each sensor 120 comprises a status indicator in form of a light emitting diode (LED). The LED can be controlled by the microcontroller to indicate an operational state of the sensor 120. Depending on the number of states to be signaled, a single color LED or a multicolor LED may be used. The LED may also be used during initial configuration of the energy metering system 100 as described below. Furthermore, the LED may be used for more advanced applications, as described in more detail below.

In one embodiment, the sensor devices are attached to the individual circuit breakers 114 by means of an adhesive strip or an adhesive layer on the back of a housing of the sensor devices. Other attachment means, such as elastic clips configured to clip onto a standardized housing of a circuit breaker 114 or a frame that is laid over the circuit breaker 114 including sensor electronics and an area for placing individual marker or label information, may be employed. Such mechanical attachment means ensure a consistent placement of a sensor 120 on top of a circuit breaker 114 at a specific location, corresponding, for example, to an emission hotspot of a magnetic field. The accurate placement of the sensors 120 at a well-defined position improves the comparability of the measurements obtained by different sensors 120.

The individual sensors 120 are connected by an internal bus system not visible in FIG. 1. The bus system may be a parallel bus system having a plurality of parallel bus lines connected to each one of the row of sensors 120. Alternatively, the bus system may also be configured as a daisy chain, i.e. for forwarding data from one sensor 120 to the next. In the described embodiment, the bus system combines both architectures. In particular, a first part of the bus comprising power supply, data and clock lines is connected in parallel to all sensors 120. Among others, this allows to synchronize the operation of all sensors 120 of the sensor sub-system 110. A second part of the bus comprises address lines for connecting all sensors 120 of a row of sensors in a daisy chain configuration, allowing to sequentially address each one of the sensors 120 in order.

At one end of each row of sensors 120, connection cables 122 and 124 are connected to the first sensor 120 of that column. In the depicted embodiment, the connection cables 122 and 124 are connected to a junction box 126. As detailed above with respect to the sensors 120, the junction box 126 is preferably fitted to the distribution panel 112 by means of an adhesive tape, an adhesive layer or a magnetic fixture such that it can be fitted without opening the distribution panel 112 and without specialized tools. In another embodiment, the last sensor 120 of a first row of sensors 120 may be connected directly to a first sensor 120 of a further row of sensors 120, such that all sensors 120 form a single chain of sensors 120.

The sensor sub-system 110 may comprise further components not visible in FIG. 1. For example, the sensor sub-system 110 may comprise as a motion detector detecting the presence of a person in proximity to the distribution panel, or a front door sensor detecting an opening state of a covering door of a fuse box enclosing the distribution panel 112. Such additional sensor data may be used by the energy metering system 100 to interrupt the load measurement in case maintenance is performed at the distribution panel 112, which may cause incorrect measuring results. Alternatively, data from such sensors may also be used to trigger a recalibration of the energy metering system 100 as described in co-pending application EBL-003. A recalibration can be used to adapt the energy metering system 100 to a changed configuration or other external influences, such as a different background magnetic field. In addition, different sets of calibration data may be stored for different operation environments, e.g. with an open or closed fuse box. In this case, data from a door sensor may be used to switch the sets of calibration data accordingly to improve the measuring results. Moreover, the energy metering system 100 may generate a notification to a user or administrator to highlight that the door has been opened or left open.

The sensor sub-system 110, comprising the sensors 120, the connection cables 122 and 124 as well as the junction box 126, is connected to the data collection sub-system 140 by means of a feed cable 130. In particular, the feed cable 130 is plugged into the junction box 126 at one end and into a local data aggregation device 142 at the other end.

In the described embodiment, the data aggregation device 142 is integrated into an AC adapter type housing with a plug connector for plugging the data aggregation device 142 into a conventional wall socket 144. Plugging the data aggregation device 142 into the wall socket 144 powers up the data collection sub-system 140 and the connected sensor sub-system 110. Moreover, plugging the data aggregation device 142 into the wall socket 144 also connects the data aggregation device 142 to a circuit branching off the distribution panel 112. This in turn allows an automatic calibration of the energy metering system to take place as described in more detail in co-pending application EBL-003.

Although not shown in FIG. 1, the data aggregation device may comprise further interfaces for connecting other sensors to the energy metering system 100. For example, the data aggregation device 142 may comprise a plug connector or wireless interface for collecting data from other utility or home automation sensors, such as a gas meter, a water meter, or a heat meter. This data may also be recorded together with the electric load information in order to enable a combined power metering and billing for the site.

In the embodiment of FIG. 1, the data collection sub-system 140 is arranged in proximity to the distribution panel 112, e.g. in the same room, but outside of the distribution panel 112 or a surrounding fuse box itself. In contrast, the data analysis sub-system 170 is arranged at a different location. For example, the distribution panel 112, the sensor sub-system 110 and the data collection sub-system 140 may be installed in a basement, a garage or another hard to reach place of a building. In contrast, the data analysis sub-system 170 may be installed in a corridor, an office or a living room inside that building. In other embodiments, the data collection sub-system 140 and/or the data analysis sub-system 170 may be integrated into the distribution panel 112.

In order to establish a data link between the data collection sub-system 140 and the data analysis sub-system 170, the data aggregation device 142 comprises a wireless transmission system 146, such as a Wi-Fi link in accordance to IEEE standard family 802.11. In the embodiment of FIG. 1, the data analysis sub-system 170 comprises a remote terminal 172 with a corresponding wireless transmission system 174. Alternatively, the data aggregation device 142 and the remote terminal 172 may also be connected by means of a direct cable connection or another suitable data transmission system. In particular in case the data aggregation device 142 is integrated into the distribution panel 112, a power line communication may be used to avoid problems with wireless data communication from within a fuse box. Moreover, the data aggregation device 142, the terminal 172 and/or other parts used for data processing may be connected to a data network, such as the Internet, for data exchange.

In the described embodiment, the remote terminal 172 is fitted to a wall using a backplate 176, which also provides the terminal 172 with electrical energy by wireless power transmission. Alternatively, the terminal 172 may comprise a built-in energy supply or may be connected to an external power supply by means of a cable. The electrical energy is supplied from an AC/DC adapter 178 connected to the backplate 176 by means of a supply cable 180. The AC/DC adapter 178 may be plugged into any socket at a location where the terminal 172 is to be installed.

In the described embodiment, the terminal 172 performs most of the data processing of the energy metering system 100. In particular, it receives sensor data provided by the sensors 120 regarding the strength of a magnetic field in the area of the individual circuit breakers 114, as well as a reference current and a reference voltage determined by the data aggregation device 142. The processing of the received data by the terminal 172 is described in more detail in co-pending application EBL-003. In alternative embodiments, part or all of the processing is performed by other part of the data processing system, e.g. the sensor sub-system 11 or the data-collection sub-system 140. Moreover, some or all of the processing may also be performed by an external entity over a data network, such as a cloud service provided by a utility provider.

In the embodiment described with reference to FIG. 1, the load information obtained by the terminal 172 is also forwarded to a cloud service 192 arranged in a data network 190, in particular the Internet. For this purpose, the terminal 172 is connected to the data network 190 by means of a network component 182, for example a modem, a router, or a wireless data network access device. Alternatively, the data aggregation device 142 may forward the load information to the cloud service directly. In this case, the terminal may download the load data from the cloud service 192 rather than from the data aggregation device. The cloud service 192, which may be provided by the utility provider such as the energy provider or an external service company, comprises a database 194 for storing electrical load information. In the described embodiment, the database 194 comprises current and historical load information of all electricity consumers having a compatible energy metering system 100. In addition, the database 194 may also store further load information, for example load information reported by conventional smart meter devices.

In order to visualize the current load of each circuit breaker 114 of the distribution panel 112, a user of the system, such as an energy consumer, an electrical technician or a site administrator, may visualize the load data calculated by the data aggregation device 142, the terminal 172 or by the cloud service 192 using a portable device 196.

In the described embodiment, the portable device 196 is a conventional smartphone having a built-in camera as well as a high resolution display. In addition, the portable device 196 has one or more wireless data communication interfaces which are capable of connecting to the local data aggregation device 142, the terminal 172 and/or the cloud service 192 using one or several data networks. As described in more detail later, the portable device 196 may identify the individual circuit breakers 114 of the electrical distribution panel 112 and overlay a live image of the electrical distribution panel 112 with the obtained load information.

FIG. 2 shows a group of four circuit breakers 114. For example, the group of circuit breakers 114 may be arranged in the distribution panel 112 according to FIG. 1. As can be seen in FIG. 2, each circuit breaker 114 is arranged in a separate housing 210. The housing 210 has a front surface 212. An operating element 214 of the circuit breaker, e.g. a switch for disconnecting or connecting a corresponding circuit or resetting the circuit breaker 114, is arranged at the front surface 212. Opposite the front surface 212, an indentation 216 is formed on a housing 210 for placing the circuit breaker 114 on a corresponding distribution rail or a similar mounting structure. Moreover, each circuit breaker 114 comprises another terminal for connecting the circuit breakers 114 to a corresponding electrical circuit. The connection terminal of the circuit breakers 114 are arranged on the rear side of the housing 210 and are therefore not visible in FIG. 2.

As shown in FIG. 2, a sensor device 220 comprising a sensor circuit may be placed on the front surface 212 of each one of the circuit breakers 114. Each sensor device 220 has a base surface preferably no larger than the front surface 212 of the circuit breaker 114. In the described embodiment, a side of the sensor device 220 to be placed on the circuit breaker 114 is equipped with an adhesive film for mounting it on the front surface 212.

A status indicator 224 is integrated into a front surface 222 of each sensor device 220, which is illuminated by one or several light emitting devices arranged on the inside of each sensor device 220. In the embodiment shown in FIG. 2, the status indicator 224 also serves as a design element of the sensor device. The internal light-emitting devices can be lit up by a microprocessor of the sensor device 220 or the data aggregation device 142 in a manner described further below.

Alternatively or in addition, a machine readable tag, such as a bar code or a matrix code may be placed on the front surface 222 of the sensor device 220. Such a bar code can be scanned by the portable device 196 and may contain, for example, an identifier or type of the sensor 120 or the installed system.

In a further variation of the embodiment shown in FIG. 2, a machine-readable identifier is placed in proximity to the circuit breakers 114, e.g. between two rows of circuit breakers 114. The machine-readable code may comprise a code describing the access to sensor data information for this installment. For identifying the number and position of the individual sensors 120 attached to corresponding circuit breakers 114, the energy metering system 100 may light up the status indicators 224 of each sensors 120 sequentially as detailed below.

Figure 3:
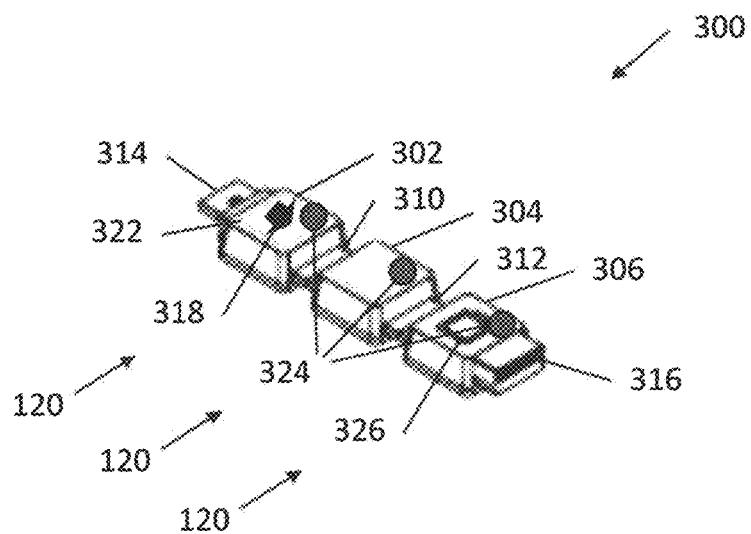
FIG. 3 shows a sensor strip in accordance with another embodiment of the present invention.

FIG. 3 shows an alternative embodiment of a sensor device. In contrast to the individual sensor devices 220 shown in FIG. 2, FIG. 3 shows a sensor device in form of a sensor strip 300 comprising three sensors 120. Of course, in other embodiments, more or less sensors 120 may be integrated to form a sensor strip. Each of the sensors 120 is integrated into a separate sensor housing 302, 304, and 306. The sensor housings 302 and 304 are connected by a first flexible strip 310. The sensor housings 304 and 306 are connected by a second flexible strip 312. By means of the flexible strips 310 and 312, each one of the sensors 120 can be fitted on a front surface 212 of a neighboring circuit breaker 114, even in the presence of typical tolerances.

A first plug connector 314 is arranged at the first sensor housing 302 for connecting the sensor strip 300 with the data aggregation device 142. In particular, the first plug connector 314 may be connected to the connection cable 122 or 124 for connecting the sensor strip 300 with the junction box 126. Moreover, a second plug connector 316 is arranged at the second sensor housing 306 of the third sensor 120. The second plug connector 316 is preferably configured to accept a first plug connector 314 of a further sensor strip 300, such that any number of sensor strips 300 may be cascaded.

An identification symbol 318 is arranged on a front surface 322 of the first sensor housing 302. In the shown embodiment, the identification symbol 318 comprises a relatively thick, dark arrow on a light background, indicating both the position of the first sensor 120 as well as the direction of further sensors 120 attached downstream of the first sensor 120. The identification symbol 318 is chosen so that it can be relatively easily detected by an image analysis algorithm executed by a processor of the portable device 196. In this way, by identifying one or several identification symbols 318, the portable device 196 may determine the number and position of sensor devices 220 within a captured live image of the electrical distribution panel 112. As the sensors 120 are associated with corresponding circuit breakers 114, in this way the portable device may also determine the position of corresponding circuit breakers 114 and thus circuits.

In addition, a light-emitting device 324 is arranged on the front surface 322 of each one of the second sensor housings 302, 304 and 306. In the shown embodiment, the light-emitting devices 324 are relatively bright, conventional LED devices that can be controlled by a microprocessor of the sensor strip 300 for emitting a lighting sequence, such as a sequence of pulses of one or several colors.

The front surface 322 of the third sensor housing 306 comprises a decorative element 326. In the embodiment described, the decorative element 326 serves as a trade mark for the manufacture of the sensor strip 300. However, in another embodiment, the decorative element 326 may also serve as a further identification symbol marking the end of the sensor strip 300.

As detailed above, each of the sensor devices 220 or 300 may comprise a microcontroller for controlling a respective light-emitting device. By means of said microcontroller, a predetermined illumination sequence may be generated. The illumination sequence may be determined locally by the microcontroller, or may be provided by other parts of the data processing system, such as the data aggregation device 142, the terminal 172, the cloud service 192 or the portable device 196. The illumination sequence may be relatively simple, for example a constant green light to indicate the operation of the sensor device 220 and a constant red light or no light for the indication that the sensor device 220 is not operational.

In accordance with at least one embodiment of the present invention, a more complex illumination sequence is used to transmit encoded information of the sensor device 220 or 300 to the portable device 196. In a first, still relatively simple embodiment, the illumination sequence emitted by each sensor device 220 is used to support the identification of respective sensors 120 in a live image captured by the portable device 196. For example, a sequence number of an individual sensor device 220 or a sensor strip 300, determined by an enumeration of sensor 120 coupled to the same bus system, may be indicated by a coded flash sequence of the light-emitting device 324. For example, a frequency of the operation of the light-emitting device 324 may be selected in accordance with an order of the sensor device 220 within a row of sensor devices 220. Alternatively, a common preamble followed by a coded address, for example using a pulse code modulation, may be used to transmit the coded address to the portable device 196. The coded address may comprising a unique address of the data aggregation device followed by a sequence number of a particular sensor 120 connected to the data aggregation device 142. Inversely, the portable device 196 may specifically address a single sensor 120 of a row of sensors 120 to activate its light emitting device. By enumerating and activating all sensors 120 sequentially, the portable device 196 may thus identify each sensor 120 in the captured live image.

Moreover, in the same or a different embodiment, in a second mode of operation, the illumination sequence of the sensor device 220 or 300 may be used to transmit data associated with the sensed electrical load from the sensor device 220 to the portable device 196. For example, again using a pulse code modulation, the relative load of a circuit breaker 114 may be communicated to the portable device 196. For example, a pulse code with a duty cycle of 10% may indicate that the circuit breaker 114 is loaded with 10% of a maximum capacity. In contrast, a pulse code with a duty cycle of 100% may indicate that the circuit breaker 114 is operated at 100% of the maximum load. Rather than using a continuous range of relative load values, a number of discrete load levels, e.g. 1 to 10, may be used instead. Attention is drawn to the fact that the maximum load indicated by the lighting sequence may differ from the nominal maximum load of the circuit breaker 114. For example, circuit breakers rated at a maximum current of 16 A can often be operated with a constant current 10% above the maximum rating without triggering the circuit breaker. Thus, the encoding range of the illumination sequence may extend beyond the nominal range of the circuit breaker 114. In case multiple data items or data items with a high precision or update frequency are to be transmitted to the portable device 196, in addition to a pulse coding, other coding techniques such as amplitude modulation and/or color modulation of the lighting sequences may be used to increase the transmission bandwidth.

In case load information is communicated directly from the sensor devices 220 or 300 to the portable device 196, a separate data connection between the portable device 196 and further components of the energy metering system 100 may not be necessary.

Figure 4:
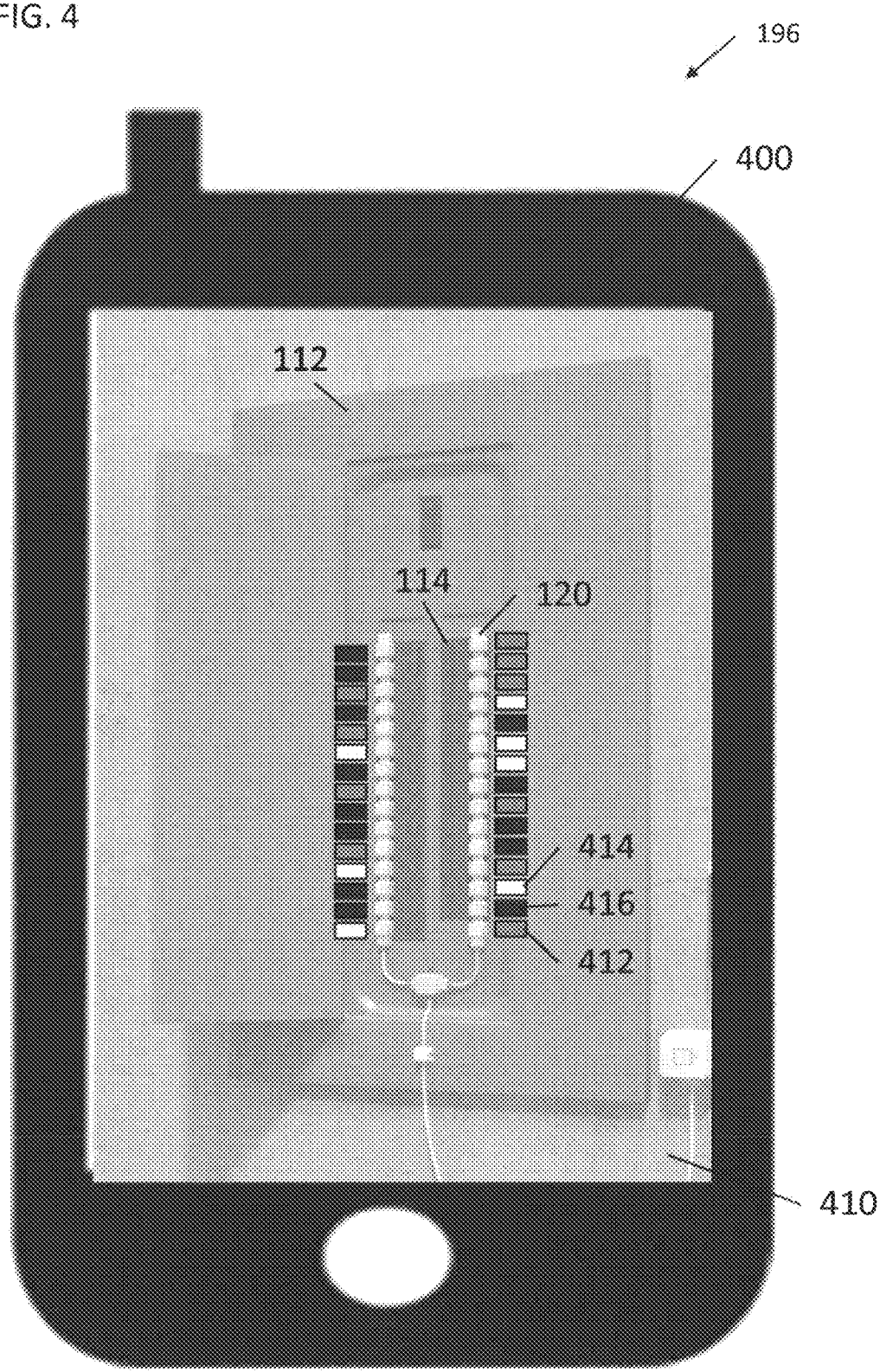
FIG. 4 shows a portable device displaying a heat view of a distribution panel in accordance with an embodiment of the present invention.

FIG. 4 shows a portable electronic device 196 in form of a conventional smartphone 400. As such, the smartphone 400 has a display screen 410 arranged on its front side and a high resolution camera arranged on its opposite back side not visible in FIG. 4.

Using the camera, the smartphone 400 may capture a live image of the electrical distribution panel 112. Said live image can be displayed on the display screen 410 using an appropriate software of the smartphone 400, in particular a smartphone app associated with the energy metering system 100. Based on identification symbols and/or an illumination sequence emitted by a light-emitting device of the sensor device 220 or the sensor strip 300, the software running on the smartphone 400 detects the position of each the sensors 120 arranged on the circuit breakers 114 within the live image. In a further embodiment, the position of circuit breakers 114 and/or the sensors 120 may be detected by another image analysis algorithm, even in the absence of an identification symbol and/or a light-emitting device.

In either way, the smartphone 400 obtains current load information for each circuit protected by a corresponding circuit breaker 114 detected. In one embodiment, the load information may be communicated directly by means of a corresponding illumination sequence from the sensor devices 220 or sensor strips 300 as detailed above. Alternatively, the load information may be queried from the database 194 of the cloud service 192 or received directly from the data aggregation device 142 or the terminal 172.

In a first view of the smartphone app, the load data may be displayed in proximity of the corresponding circuit breaker 114, for example as a numerical value, a bar chart, or a colored icon representative of the electrical current or power of the associated circuit.

In case a relative load of the circuit breakers is to be displayed, the portable device 196 may also obtain a maximum rating of each circuit breaker 114. The maximum rating may correspond to a default rating, e.g. 16 A, or may be supplied by a user of the smartphone 400. Alternatively, the received electrical load information may also comprises a maximum rating and/or other metadata for each of the circuit breakers 114 or sensors 120. Moreover, a maximum rating may be detected based on optical character recognition of a corresponding marking of the identified circuit breakers 114. Based on a comparison of an electrical load detected by each one of the sensors 120 with the maximum load of the corresponding circuit breaker 114, the smartphone app may generate a so-called heat map of the electrical distribution panel 112, indicating how close to its maximum rating each circuit breaker 114 is operated.

In the illustration of FIG. 4, a relatively simple representation using three different classes of loads is used to give a user a quick overview of the electrical load of the electrical distribution panel 112. In particular, different color codes 412, 414, and 416 are used for unloaded, normally loaded and overloaded electrical circuits. In particular, a green color code 412 indicates no or very low currents, a yellow color code 414 indicates currents below the maximum rating and a red color code 416 indicated circuits close to or above the maximum rating. This representation represents a so-called "heat view" or "augmented reality" of the electrical distribution panel 112.

By means of the augmented reality view shown in FIG. 4, a potentially dangerous overuse of one or several circuits can be recognized at a single glance. For example, in frequently changing electrical installations, such as decorative installations of retail units comprising a relatively large number of electrical appliances such as lights, overuse of one or several circuits can occur. Such a situation be easily detected using the described system and thus avoided without the need for a skilled technician.

In addition, other data item of individual electrical circuits or common to multiple electrical circuits may also be included in the generated view. For example, a power factor for each circuit may be determined by the data aggregation device 142 or terminal 172 and be displayed next to each circuit breaker 114. Moreover, a reference voltage, an active or reactive power or frequency of an AC voltage supplied to the distribution panel 112 may be displayed. In case of a multiphase supply network, a reference voltage for each phase and a relative phase angle may also be displayed by querying other parts of the energy metering system 100.

In addition to a current load status, the same or another app of the smartphone 400 may also be used to generate, store and display other views of the electrical distribution system based on the identified position of the circuit breakers 114, sensors 120 and corresponding load information. For example, the portable device 196 could create and store a technical drawing of the electrical distribution board 112 together with the circuit breaker layout and enumeration of the corresponding circuits and/or sensors 120 for documentation of the electrical installation at a given site. Another example is to retrieve from the system 100 a usage of each breaker 114 and to visualize it in augmented reality. For example, the display 410 of the smartphone 400 may not only show electrical characteristics per circuit breaker 114, but also information in regards to a usage and an area coverage of the respective circuit breaker 114.

Moreover, a smartphone app may provide data about a special arrangement of the sensors 120 or similar configuration data back to the data aggregation device 142, the terminal 172 or the cloud service 192. Such data may be particular useful for a setup or calibration of the energy metering system 100. Additional configuration data, such as names of particular devices connected to a circuit, may also be entered by the user using the smartphone app.

Moreover, while the use of the smartphone app has been detailed with respect to sensors attached to individual circuit breakers 114 of an electrical distribution panel, the described concept may also be used in other contexts. In particular, the app may be used to identify individual sensors to detect an electrical current or load of other parts of an electrical installation, such as smart meters, individually monitor electrical consumers, intelligent switches and so on. In this case, the smartphone app may identify a sensor device based on a barcode or illumination sequence as detailed above and provide more information for the corresponding part of the electrical installation on its display. For example, it may overlay a captured image of an individual sensor on a power cord of consumption load, e.g. a lighting fixture, such that the user can check with the smartphone app how much power the consumption load consumes by filming the single sensor only.

As detailed above, the various components of the described energy metering system 100 are particularly easy to install, even by a consumer. In particular, it is not necessary to open the distribution panel 112 or disconnect any wires of the energy distribution system in order to perform the installation. This eliminates the risk of an electrical shock and the requirement for a specialized or certified technician.

For example, as detailed above with respect to FIG. 1, the individual sensors 120 used for monitoring the circuits branching off the respective circuit breakers 114 may be simply attached to the front of the circuit breakers 114 by means of a double-sided adhesive tape or Velcro fastener. Moreover, the data aggregation device 142 and the terminal 172 may simply be plugged into wall sockets 144. Together with a smartphone app downloaded from a corresponding software depository, the energy metering system 100 is ready for use.

As detailed in co-pending application EBL-003, data processing, i.e. a calibration as well as the conversion of the sensor data into electrical load information may be performed by either the data aggregation device 142 or the terminal 172. Furthermore, the data processing may also be performed by an external service provide such as a utility metering company, for example via the cloud service 192. In this embodiment, either the aggregation device 142 or the terminal 172 may be configured to forward the sensor data obtained by the sensors 120 to a wide area data network 190, in particular the Internet.

In case the sensor data is transmitted through a public network such as the Internet, data encryption can be applied by the data aggregation device 142, the terminal 172, the network component 182 or the portable device 196. Of course, for the sake of increased security, data encryption may also be applied for communication between the data aggregation device 142, the terminal 172 and the portable device 196, in particular in case of a wireless connection between them.

The energy metering system 100 described above allows the implementation of many novel applications, such as a fine grained analysis of the power consumption of a particular site, sub-unit, user, circuit, or electric device.

For example, energy consumption in different rooms of a building or apartment may be analyzed. Moreover suspicious activity may be detected automatically by noticing a high power consumption at unusual times or at unusual location. One further application is the indirect detection of the presence or absence of people in a particular part of a building, based on the electrical power consumption.

Moreover, based on a comparison of load information of a particular site with those of other sites or average values, a consumer may be provided with suggestions in order to reduce his own energy consumption and therefore help to reduce the generation of greenhouse gases. Similarly, a user may also provide information about an individual budget, for example by means of the terminal 172 or a web service.

In this case, the energy metering system 100 may draw the user's attention to a high energy consumption before the preset power budget is exceeded, enabling the consumer to reduce his energy uptake to stay within an agreed budget. In addition, a supplier may predict the power needs of a particular consumer based on historical records of this consumer and potential further information, such as weather or temperature data.

In addition, an energy usage may be monitored over time with a high resolution, e.g. each minute, second or even more often, e.g. with a frequency of 100 Hz or more. By monitoring circuit specific load information over time, unusual events such as faults or wear out of appliances may be detected by noticing a sudden or slow drop or increase of associated electrical loads. With even higher sampling frequencies, such as several kHz, a harmonic analysis of the switch-on characteristic of individual electric devices may be performed, allowing to identify individual devices even when they are connected to the same circuit. Such an analysis may be based on a Fourier transformation of the obtained currents.

While the energy metering system 100 has been described with respect to various, currently preferred embodiments, attention is drawn to the fact that the described system may be altered in several ways without departing from the inventive concepts disclosed herein. In particular, rather than using a conventional smartphone running an app software, a dedicated portable device may be used in order to monitor or record the load status of the distribution panel 112.

LIST OF REFERENCE SIGNS 100 energy metering system
110 sensor sub-system
112 distribution panel
114 circuit breaker
120 sensor
122 connection cable
124 connection cable
126 junction box
130 feed cable
140 data collection sub-system
142 data aggregation device
144 wall socket
146 wireless transmission system
170 data collection sub-system
172 remote terminal
174 wireless transmission system
176 backplate
178 AD/DC adapter
180 supply cable
182 network component
190 data network
192 cloud service
194 database
196 portable electronic device
210 housing (of the circuit breaker)
212 front surface (of the circuit breaker)
214 operating element
216 indentation
220 sensor device
222 front surface (of the sensor device)
224 status indicator
300 sensor strip
302, 304, 306 housing (of the sensor)
310, 312 flexible strip
314 first plug connector
316 second plug connector
318 identification symbol
322 front surface
324 light-emitting device
326 decorative element
400 smartphone
410 display screen
412, 414, 416 color codes

What is claimed is:

1. A visualization system for visualizing electrical loads of an electrical distribution panel, the visualization system comprising:
a sensor arrangement configured to sense an electrical load of a plurality of electrical circuits, each electrical circuit of the plurality of electrical circuits being protected by a corresponding circuit breaker of a plurality of circuit breakers of the electrical distribution panel, the sensor arrangement comprising a corresponding plurality of sensors, each sensor of the plurality of sensors being arranged in a sensor housing separate from a circuit breaker housing of a corresponding circuit breaker and retrofitted outside the circuit breaker housing onto a front surface of the circuit breaker housing of the corresponding circuit breaker of the plurality of circuit breakers and configured to provide corresponding sensor data;
a data processing system configured to aggregate and store the sensor data of the plurality of sensors into electrical load information for the plurality of electrical circuits; and
a portable device comprising an image capturing unit and a display screen, the portable device being configured to
obtain a live image of at least a part of the electrical distribution panel from the image capturing unit,
identify a set of individual circuit breakers from the plurality of circuit breakers by identifying the corresponding sensors that are mounted on the respective front surfaces of the plurality of circuit breakers and are in the live image,
obtain a current load status at least for a subset of electrical circuits of the plurality of circuits, which are protected by the identified set of individual circuit breakers, based on the electrical load of the data processing system, and
display the obtained live image overlaid with the obtained current load status of the subset of electrical circuits in a structured way on the display screen of the portable device, wherein the current load status for each circuit of the subset of circuits is displayed in proximity to each one of the corresponding individual circuit breaker of the identified set of individual circuit breakers to generate an augmented reality view of the electrical distribution panel.

2. The visualization system according to claim 1, wherein each sensor of the plurality of sensors comprises at least one visible identification mark arranged in proximity to or on a front surface of the respective sensor.

3. The visualization system according to claim 2, wherein the at least one visible identification mark comprises a machine readable tag, the machine readable tag being a bar code or a matrix code, and the portable device is configured to identify the set of individual circuit breakers within the live image based on information encoded in the machine readable tag.

4. The visualization system according to claim 2, wherein the at least one visible identification mark comprises a light emitting device, and the portable device is configured to identify the set of individual circuit breakers within the live image based on information encoded in an illumination sequence emitted by the light emitting device.

5. The visualization system according to claim 1, wherein at least two sensors of the plurality of sensors are combined to form a sensor group, each sensor group is attached to a front surface of a corresponding group of the plurality of circuit breakers and comprises at least one visible identification mark arranged in proximity to or on a front surface of the sensor group.

6. The visualization system according to claim 5, wherein the at least one visible identification mark comprises a machine readable tag, the machine readable tag being a bar code or a matrix code, and the portable device is configured to identify the set of individual circuit breakers within the live image based on information encoded in the machine readable tag.

7. The visualization system according to claim 5, wherein the at least one visible identification mark comprises a light emitting device, and the portable device is configured to identify the set of individual circuit breakers within the live image based on information encoded in an illumination sequence emitted by the light emitting device.

8. The visualization system according to claim 4, wherein the plurality of sensors and/or the data processing system is configured to transmit a unique illumination sequence through each one of the light emitting devices to identify each sensor of the plurality of sensors.

9. The visualization system according to claim 4, wherein the at least one of the sensors and the data processing system is configured to transmit at least one illumination sequence through at least one of the light emitting devices indicative of the obtained current load status of at least one electrical circuit of the plurality of electrical circuits.

10. The visualization system according to claim 1, wherein the data processing system comprises at least one data processing device, wherein the at least one data processing device is connected to a data network and the portable device comprises at least one wireless data reception device for connection to the data network, wherein the current load status is transmitted from the data processing device over the data network to the portable device.

11. The visualization system according to claim 1, wherein displaying the obtained current load status comprises generating and displaying a heat map visualizing an instantaneous electrical current flowing through the set of identified individual circuit breakers.

12. The visualization system according to claim 1, wherein displaying the obtained current load status further comprises generating and displaying a status map visualizing at least one of a type of at least one of the identified circuit breakers, a rating of at least one of the identified circuit breakers, a status of at least one of the identified circuit breakers and an abnormal condition of at least one of the identified circuit breakers.

13. The visualization system according to claim 1, wherein at least one of the portable device and the data processing system is configured to generate a technical drawing of the electrical distribution panel including a layout of the plurality of circuit breakers based on information stored in the data processing system and the identification of circuit breakers in the live image of the electrical distribution panel.

14. The visualization system according to claim 1, wherein each sensor of the plurality of sensors comprises:
a microcontroller;
at least one sensor circuit configured for sensing the electrical load of at least one of the plurality of electrical circuits; and
a single light emitting diode controlled by the microcontroller of each sensor and configured to emit at least one illumination sequence comprising encoded information.

15. The visualization system according to claim 14, wherein the encoded information comprises at least one of an identifier of the sensor, an electrical load sensed by the sensor circuit, an identifier of the circuit breaker, a type of the at least one circuit breaker, a rating of the at least one circuit breaker, a status of the circuit breaker, and an abnormal condition of the circuit breaker.

16. The visualization system according to claim 14, wherein the sensor further comprises a bus interface, the microcontroller being connected with the at least one sensor circuit, the single light emitting diode, and the bus interface, the microcontroller being configured to transmit sensor data corresponding to an electrical load sensed by the sensor circuit over the bus interface to a data processing system for storage.

17. The visualization system according to claim 16, wherein the microcontroller is further configured to receive control data over the bus interface from the data processing system and to control the single light emitting diode in accordance with the received control data.

18. A method for visualization of electrical loads of an electrical installation using a portable device, the method comprising:
capturing, by the portable device, a live image of at least a part of an electrical installation comprising a plurality of circuit breakers;
identifying, by the portable device, at least one sensor device arranged in a sensor housing separate from a circuit breaker housing of a corresponding circuit breaker and retrofitted outside the circuit breaker housing onto a front surface of the circuit breaker housing of the corresponding circuit breaker of the plurality of circuit breakers within the captured live image;
sensing, by the at least one sensor device, an electrical load of at least one electrical circuit protected by the corresponding circuit breaker associated with the at least one identified sensor device;
obtaining, by the portable device, a current load status corresponding to the sensed electrical load of the at least one electrical circuit; and
displaying, by the portable device, the captured live image overlaid with obtained current load status of the at least one circuit in a structured way on a display screen of the portable device to generate an augmented reality view of the electrical distribution panel.

19. The method according to claim 18, wherein the at least one sensor device comprises a single light emitting diode, and, in the step of obtaining, the current load status is transmitted directly from the sensor device to the portable device by an illumination sequence emitted by the single light emitting diode, the illumination sequence comprising encoded load data.

20. The method according to claim 18, wherein the at least one sensor device is connected to a data processing system arranged in a data network, and, in the step of obtaining, the current load status is transmitted from the data processing system via the data network to the portable device by a wireless data connection.

21. A smartphone app, stored in a non-volatile memory device, for visualization of electrical loads of an electrical installation, the smartphone app being configured to perform the following steps when executed on at least one processor of a smartphone:

capturing a live image of at least a part of the electrical installation comprising a plurality of circuit breakers;

identifying at least one sensor device arranged in a sensor housing separate from a circuit breaker housing of a corresponding circuit breaker and retrofitted outside the circuit breaker housing onto a front surface of the circuit breaker housing of the corresponding circuit breaker within the captured live image;

obtaining a current load status corresponding to an electrical load of at least one electrical circuit protected by the corresponding circuit breaker and associated with the at least one identified sensor device; and generating a structured view comprising the obtained current load status of the at least one circuit for display on a display screen of the smartphone; and displaying the live image of the electrical installation overlaid with the obtained current load status to generate reality view of the electrical distribution panel.

22. The smartphone app according to claim 21, wherein the smartphone app identifies a sensor device based on a barcode or illumination sequence and provides more information for the part of the electrical installation on the display screen.

23. The visualization system according to claim 1, wherein the current load status for each circuit is displayed as a numerical value, a bar chart, or a colored icon representative of the electrical current or power of the associated circuit.

24. The visualization system according to claim 1, wherein a relative load of each circuit breakers of the identified set of individual circuit breakers with respect to an obtained maximum rating of the respective circuit breaker is displayed.

* * * * *